US012738389B2

(12) United States Patent
Tadjer et al.

(10) Patent No.: US 12,738,389 B2
(45) Date of Patent: Sep. 15, 2026

(54) SEMICONDUCTOR BETAVOLTAIC BATTERIES WITH P-N DIODES

(71) Applicant: The Government of the United States of America, as represented by the Secretary of the Navy, Arlington, VA (US)

(72) Inventors: Marko J. Tadjer, Vienna, VA (US); Travis J. Anderson, Gainsesville, FL (US); Francis J. Kub, Arnold, MD (US); Alan G. Jacobs, Rockville, MD (US); Karl D. Hobart, Alexandria, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 196 days.

(21) Appl. No.: 18/763,555

(22) Filed: Jul. 3, 2024

(65) Prior Publication Data

US 2026/0011463 A1 Jan. 8, 2026

(51) Int. Cl.
*G21H 1/02* (2006.01)
*G21H 1/06* (2006.01)
(Continued)

(52) U.S. Cl.
CPC ................. *G21H 1/02* (2013.01); *G21H 1/06* (2013.01); *H10F 30/295* (2025.01); *H10F 71/00* (2025.01);
(Continued)

(58) Field of Classification Search
CPC .......... G21H 1/02; G21H 1/06; H10F 30/295; H10F 71/00; H10F 77/12; H10F 77/148; H10F 77/1246
(Continued)

(56) References Cited

U.S. PATENT DOCUMENTS 7,663,288 B2 * 2/2010 Chandrashekhar ...... G21H 1/02 310/303
7,939,986 B2 5/2011 Chandrashekhar et al.
(Continued)

OTHER PUBLICATIONS

Eugene B. Yakimov, Alexander Y. Polyakov, Stephen J. Pearton; Betavoltaic cell based on Ni/β-Ga2O3 and 63Ni source. J. Vac. Sci. Technol. Nov. 30, 2021 (Year: 2021).*
(Continued)

*Primary Examiner* — Ahmed Elnakib
(74) *Attorney, Agent, or Firm* — US Naval Research Laboratory; Jorie L. Stroup

(57) ABSTRACT

Betavoltaic battery devices and methods of making are presented. In embodiments, an electrically inactive betavoltaic battery device comprises: a p-type semiconductor layer including at least one stable isotope that transforms into a beta emitter upon irradiation with thermal neutrons; and an n-type semiconductor beta-absorber layer configured to absorb beta particles; wherein the p-type semiconductor layer and the n-type semiconductor layer form a p-n diode, and wherein the electrically inactive betavoltaic battery device is configured to be transformed into an electrically active betavoltaic battery upon irradiation with thermal neutrons. The electrically inactive betavoltaic battery device may be transported to an irradiation facility, where it is irradiated with thermal neutrons to convert the inactive betavoltaic batter device to an active betavoltaic battery device.

20 Claims, 7 Drawing Sheets

(51) Int. Cl.

| | |
|---|---|
| ***H10F 30/295*** | (2025.01) |
| ***H10F 71/00*** | (2025.01) |
| ***H10F 77/12*** | (2025.01) |
| ***H10F 77/124*** | (2025.01) |
| ***H10F 77/14*** | (2025.01) |

(52) U.S. Cl.
CPC .......... *H10F 77/12* (2025.01); *H10F 77/148* (2025.01); *H10F 77/1246* (2025.01)

(58) Field of Classification Search
USPC .................................................. 310/301–303
See application file for complete search history.

(56) References Cited

U.S. PATENT DOCUMENTS

| | | | | |
|---|---|---|---|---|
| 8,134,216 | B2 * | 3/2012 | Spencer | G21H 1/02 257/29 |
| 8,487,392 | B2 | 7/2013 | Spencer et al. | |
| 9,064,610 | B2 | 6/2015 | Lee et al. | |
| 10,186,339 | B2 * | 1/2019 | Cabauy | H10F 77/124 |
| 11,764,322 | B2 | 9/2023 | Hubbard et al. | |
| 12,213,327 | B2 * | 1/2025 | Cao | H10K 59/60 |
| 2012/0133244 | A1 * | 5/2012 | Spencer | G21H 1/02 310/303 |
| 2016/0211042 | A1 | 7/2016 | Burgett | |
| 2022/0238244 | A1 | 7/2022 | Jones et al. | |
| 2023/0282384 | A1 * | 9/2023 | Kim | G21H 1/06 310/303 |
| 2023/0420539 | A1 * | 12/2023 | Spencer | H10D 8/051 |
| 2025/0253067 | A1 * | 8/2025 | Hobart | G21G 1/06 |
| 2026/0011463 | A1 * | 1/2026 | Tadjer | G21H 1/02 |

OTHER PUBLICATIONS

Lee et al. KR 10-2020-0117308 (Year: 2020).*

Kim Jin Joo; KR 10-1546310 (Year: 2015).*

Ni-63 is a P type layer (Year: 2026).*

Aydin et al., "Investigation of nickel-63 radioisotope-powered GaN betavoltaic nuclear battery", Int J Energy Res. Sep. 5, 2019;vol. 43 pp. 8725-8738, Wiley Online Library.

Honsberg et al., "GaN Betavoltaic Energy Converters", Conference Record of the Thirty-first IEEE Photovoltaic Specialists Conference, 2005., Lake Buena Vista, FL, USA, 2005, pp. 102-105, doi: 10.1109/PVSC.2005.1488079, IEEE.

Khan et al., "Design and characterization of GaN p-i-n diodes for betavoltaic devices", Solid State Electronics, Available Jun. 20, 2017, vol. 136, Oct. 2017, pp. 24-29, Elsevier Ltd.

Maximenko et al., "Optimal Semiconductors for 3H and 63Ni Betavoltaics", Sci Rep 9, 10892 (2019), Springer Nature, https://doi.org/10.1038/s41598-019-47371-6.

Naseem, et al., "Betavoltaic Nuclear Battery: A Review of Recent Progress and Challenges as an Alternative Energy Source", The Journal of Physical Chemistry C, Apr. 17, 2023, 127 (16), pp. 7565-7579, ACS Publications.

Yakimov et al., "Betavoltaic cell based on Ni/B—Ga2O3 and 63Ni source", J. Vac. Sci. Technol. A Jan. 1, 2022; 40 (1): 010401, AIP Publishing. https://doi.org/10.1116/6.0001533.

Zhao et al. "Breaking the myth: Wide-bandgap semiconductors not always the best for betavoltaic batteries", Appl. Phys. Lett. Oct. 11, 2021; 119 (15): 153904. https://doi.org/10.1063/5.0068269.

Yuan et al., "Design of a feasible high-efficiency 63Ni)/ZnO integrated betavoltaic battery",The Japan Society of Applied Physics, Feb. 22, 2023, vol. 16, 02100, Applied Physics Express.

Wang et al., "Theoretical prediction of output performanc eof 63NiO—Si heterojunction betavoltaic cell", Applied Physics Letters, Aug. 22, 2022, vol. 121, 083901, AIP Publishing, https://doi.org/10.1063/5.0100186.

* cited by examiner

SEMICONDUCTOR BETAVOLTAIC BATTERIES WITH P-N DIODES

FEDERALLY SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; nrltechtran@us.navy.mil, referencing Navy Case No. 211618-US1.

BACKGROUND OF THE INVENTION

Aspects of the present invention relate generally to betavoltaic batteries and, more particularly, to semiconductor betavoltaic batteries incorporating p-n junctions.

In general, a betavoltaic power cell or battery is a type of nuclear battery which generates electric current by absorbing beta (β) particles emitted from a radioactive source into a semiconductor absorber. The β-particles generate carriers which are collected at the p-n junction. In general, a β-particle is a high energy, high speed electron ($\beta^-$) or positron ($\beta^+$) that is ejected from a nucleus by some radionuclides during a form of radioactive decay called B-decay. Advantages of betavoltaic power cells over conventional batteries include a long service life, reliability, and compactness. Various betavoltaic power cells have been explored for supplying low-current power to devices (e.g., microelectronic devices). For example, various betavoltaic cells with Schottky barrier diodes have been evaluated. Such betavoltaic cells include those utilizing a metal β-particle source, such as nickel-63 ($^{63}$Ni), in conjunction with a semiconductor absorber configured to absorb the β-particles.

In general, a Schottky barrier diode (i.e., Schottky diode or hot-carrier diode), is a semiconductor diode formed by the junction of a semiconductor with a metal. In contrast to a Schottky barrier diode, a p-n diode is a type of semiconductor diode based upon a p-n junction. More specifically, a p-n diode is made by forming a metallurgical junction of a p-type semiconducting layer to an n-type semiconducting layer. In general, n-type semiconductors are creating by doping an intrinsic semiconductor with an electron donor element. In n-type semiconductors, electrons are the majority carriers and holes are the minority carriers. In general, p-type semiconductors are created by doping an intrinsic semiconductor with an electron acceptor element. In contrast to n-type semiconductors, in p-type semiconductors, holes are the majority carriers and electrons are the minority carriers. In general, a semiconductor-based heterojunction is the interface that occurs between two layers or regions of dissimilar crystalline semiconductors. The term p-n heterojunction refers to the contact formed by p-type and n-type semiconductors.

There remains a need for further development of betavoltaic power devices to improve the compactness and function of such devices.

SUMMARY OF THE INVENTION

In a first aspect of the invention, there is an electrically inactive betavoltaic battery device comprising: a p-type semiconductor layer including at least one stable isotope that transforms into a beta emitter upon irradiation with thermal neutrons; and an n-type semiconductor beta-absorber layer configured to absorb beta particles; wherein the p-type semiconductor layer and the n-type semiconductor layer form a p-n diode, and wherein the electrically inactive betavoltaic battery device is configured to be transformed into an electrically active betavoltaic battery upon irradiation with thermal neutrons. In implementations, the p-type semiconductor layer comprises nickel oxide including nickel-62 ($^{62}$Ni), and the n-type semiconductor beta-absorber layer is selected from the group consisting of: gallium oxide ($Ga_2O_3$), gallium nitride (GaN), silicon carbide (SiC), diamond, and aluminum nitride (AlN).

In embodiments, the n-type semiconductor beta-absorber layer is an epitaxial layer or a substrate layer. The betavoltaic battery may include one or more electrodes (e.g., nickel electrodes). In implementations, the betavoltaic battery includes a second n-type semiconductor layer (e.g., $Ga_2O_3$ or GaN), between the n-type semiconductor beta-absorber layer and the p-type semiconductor layer, where the p-type semiconductor layer, the n-type semiconductor β-absorber layer, and the second n-type semiconductor layer comprise the p-n diode. In embodiments, the p-type semiconductor layer extends into at least one trench formed in the n-type semiconductor beta-absorber layer.

In a second aspect of the invention, there is a method of making an electrically inactive betavoltaic battery device comprising: fabricating a p-n diode comprising a p-type semiconductor layer including at least one stable isotope that transforms into at least one beta-particle emitter upon irradiation with thermal neutrons, and an n-type semiconductor beta-particle absorber layer configured to absorb beta particles. This embodiment enables an electrically inactive betavoltaic battery to be manufactured at a standard semiconductor fabrication facility, and transported to a radiation facility to transform the electrically inactive betavoltaic battery to an electrically active betavoltaic battery device using thermal neutron radiation.

In another aspect of the invention, there is a method of making an electrically active betavoltaic battery comprising: providing an electrically inactive betavoltaic battery device comprising a p-type semiconductor layer including at least one stable isotope that transforms into at least one beta-particle emitter upon irradiation with thermal neutrons, and an n-type semiconductor beta-particle absorber layer configured to absorb beta particles, wherein the p-type semiconductor layer and the n-type semiconductor beta-particle absorber layer form a p-n diode; and irradiating the electrically inactive betavoltaic battery device with thermal neutrons, thereby causing the conversion of at least a portion of the at least one stable isotope to a radionuclide and creating the electrically active betavoltaic battery. In implementations, the p-type semiconductor layer comprises nickel oxide, the at least one stable isotope within the nickel oxide comprises nickel-62 ($^{62}$Ni), and the at least one beta-particle emitter comprises $^{63}$Ni.

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Figure 1:
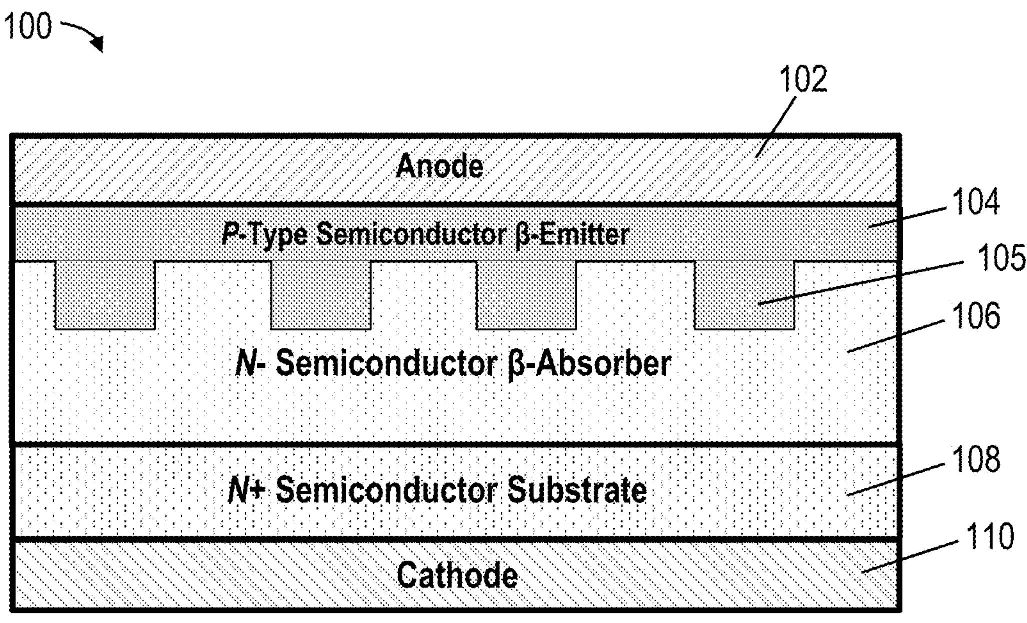
FIG. 1 depicts a first betavoltaic power source including a plurality of p-type semiconductor channels in accordance with embodiments of the invention.

Aspects of the present invention relate generally to betavoltaic batteries and, more particularly, to semiconductor betavoltaic batteries incorporating p-n junctions. In implementations, the betavoltaic batteries include wide bandgap p-n diodes in which a semiconductor absorber includes a radioactive isotope acting as an in situ beta (β) particle emitter. In embodiments, a betavoltaic power source (battery) comprises a p-type semiconductor layer acting as both a β-particle emitter and a β-particle absorber, and an n-type semiconductor layer acting as a B-particle absorber, where the p and n-type semiconductors form a p-n diode. In implementations, the p-n diode is a p-n heterojunction diode.

Advantageously, implementations of the invention reduce self-absorption of β-particles, increase β-particle emission volume and overall power produced by a betavoltaic battery, and provide for a more compact structure over existing betavoltaic structures. By way of example, implementations of the invention provide a p-n diode without the need for a separate B-particle source sheet/layer (e.g., metal layer) deposited over the p-n diode.

Low reverse-bias leakage current is desired for betavoltaic junctions. Advantageously, p-n diodes have a low reverse-bias leakage current due to the space charge region formed at the metallurgical junction between the p and n regions.

Monoclinic (β) $Ga_2O_3$ technology has experienced rapid development in recent years. After initial growth demonstrations, melt grown 100 mm diameter substrates have been commercialized using techniques such as edge-defined, film-fed (EFG) growth, Czochralski (CZ), float-zone (FZ), and vertical Bridgman (VB). Commercial epitaxial growth techniques have also resulted in 1-10 micrometer (μm) thick epitaxial layers of high quality, suitable for vertical diode demonstrations in the 5-8 kilovolt (kV) breakdown voltage range. Domestic production of semi-insulating (010) $Ga_2O_3$ substrates has been scaled up to 2 inches using Czochralski and EFG techniques, respectively. The ultra-wide bandgap of β-$Ga_2O_3$ (4.6-4.9 electron volts) results in a high critical field of 6-8 megavolts per centimeter (MV/cm) and has also enabled lateral and vertical transistor devices potentially suitable for radio frequency and high voltage power switching.

In some exemplary implementations, a nickel oxide (NiO)/gallium oxide ($Ga_2O_3$) heterojunction is formed in a three-dimensional configuration. For example, a vertical feature such as a trench or hole can be etched into an n-type or insulating $Ga_2O_3$ material layer. In implementations, p-type NiO can be deposited to partially or entirely fill the vertical feature. In embodiments, an N+$Ga_2O_3$ material layer is desirable beneath the low doping concentration n-type or insulating $Ga_2O_3$ to reduce the series resistance of the NiO/$Ga_2O_3$ betavoltaic device.

In other exemplary implementations, a NiO/gallium nitride (GaN) heterojunction is formed in a three-dimensional configuration. For example, a vertical feature such as a trench or hole can be etched into an n-type or insulating GaN material layer. A p-type NiO layer can be deposited to partially or entirely fill the vertical feature. In embodiments, an N+ GaN material layer is desirable beneath the low doping concentration n-type or insulating GaN to reduce the series resistance of the NiO/GaN betavoltaic device. In aspects of the invention, the NiO/GaN three dimensional p-n or p-i-n heterojunction can be formed in a superjunction configuration by etching trenches in GaN and entirely or partially filling the trenches with NiO. In implementations, the NiO material can be deposited by physical vapor deposition, chemical vapor deposition, atomic layer deposition, mist deposition, pulsed laser deposition, or a combination of these methods.

With initial reference to FIG. 1, a first betavoltaic power source (battery) 100 is depicted in accordance with embodiments of the invention. The betavoltaic power source 100 includes an electrode (anode) 102, a p-type semiconductor β-emitter layer 104 extending into an n-type semiconductor β-absorber layer 106, an n-type semiconductor substrate 108, and an electrode (cathode) 110. In embodiments, the n-type semiconductor β-absorber layer 106 is a drift layer. In aspects of the invention, the p-type semiconductor β-emitter layer 104 is deposited in multiple trenches or channels formed in the n-type semiconductor β-absorber layer 106, one of which is indicated at 105. Alternatively, the trenches or channels 105 of the p-type semiconductor β-emitter layer 104 may be formed in the n-type semiconductor β-absorber layer 106 via embedding methods (e.g., ion implantation methods). In accordance with embodiments of the invention, the p-type semiconductor β-emitter 104, the n-type semiconductor β-absorber layer 106, and the n-type semiconductor substrate layer 108 form a p-n heterojunction diode. In implementations, the n-type semiconductor β-absorber layer 106 comprises a lightly N-doped drift layer ($N^-$), as compared to the higher doped ($N^+$) n-type semiconductor substrate layer 108.

In implementations, the p-type semiconductor β-emitter layer 104 is NiO including at least one stable isotope, such as the pure β source nickel-62 (creating $^{62}$NiO). In embodiments, one or more stable Ni isotopes are introduced into the NiO semiconductor layer with precise quantity via thermal transmutation fluence control, eliminating the need for a coating step to coat the device with a B-radiation source material, and improving the conversion efficiency of the resulting betavoltaic battery device. The NiO may be a copper-doped NiO. In implementation, NiO can be a varied bandgap semiconductor with a bandgap in the range of 3.6 eV to 4.0 eV and can have a varied p-type concentration. In embodiments, the anode may be implemented using any low work function material to p-type NiO semiconductor such as Ni, platinum (Pt), or oxidized metals such as platinum oxide (PtOx), and iridium oxide (IrOx). In embodiments, the cathode may be in the form of any low work function material to n-type gallium oxide ($Ga_2O_3$), such as titanium (Ti), chromium (Cr), aluminum (Al), and conductive alloys such as indium-tin-oxide (ITO), and others.

In aspects of the invention, the n-type semiconductor B-absorber layer 106 and/or the n-type semiconductor substrate layer 108 comprise a wide-bandgap semiconductor material having a bandgap above 2 electron volts (eV). In aspects of the invention, the n-type semiconductor β-absorber layer 106 and/or the n-type semiconductor substrate layer 108 comprise Si (1.12 eV bandgap) or GaAs (1.4 eV bandgap). In embodiments, the n-type semiconductor β-absorber layer 106 is selected from beta-$Ga_2O_3$, GaN, silicon carbide (SiC), diamond, aluminum nitride (AlN), and other n-type semiconductors capable of forming p-n heterojunction rectifiers with the p-type semiconductor B-emitter 104. In embodiments, the n-type semiconductor substrate 108 is $Ga_2O_3$, GaN, SiC, AlN, or diamond, for example.

$Ga_2O_3$ has an advantage as a semiconductor material in that $Ga_2O_3$ material layer can have a low doping concentration. For example, in implementations, a $Ga_2O_3$ material layer can have an n-type doping concentration that is: less than $1\times10^{16}$ $cm^{-3}$, less than $5\times10^{15}$ $cm^{-3}$, less than $1\times10^{15}$ $cm^{-3}$, less than $5\times10^{14}$ $cm^{-3}$, or less than $5\times10^{14}$ $cm^{-3}$. In some embodiments, a $Ga_2O_3$ material layer can be semi-insulating or insulating. In implementations, a low n-type doping concentration is advantageous because the depletion width of a NiO/$Ga_2O_3$ p-n or p-i-n heterojunction depends on the n-type doping concentration. The depletion width will be larger for lower doping concentrations. A large depletion width is desirable because the carriers can transport to the NiO/$Ga_2O_3$ heterojunction interface by electric field drift, while some amount of carriers can also diffuse to the depletion layer for collection.

Advantageously, $Ga_2O_3$ can be patterned in a three-dimensional surface profile before NiO deposition to maximize surface area of the resulting NiO/$Ga_2O_3$ heterojunction and thus the generated current density. The strong polaron effects in $Ga_2O_3$ lead to the self-trapping of holes such that any generated holes will be trapped almost immediately, resulting in excess electron concentration available for transport upon the application of an electric field. Moreover, $Ga_2O_3$ enables large diameter wafers and thick epitaxial layers, which offer significant technological advantage in the collector area.

In implementations, an N+$Ga_2O_3$ material layer is desirable beneath a low doping concentration n-type or insulating $Ga_2O_3$ layer to reduce the series resistance of a NiO/$Ga_2O_3$ betavoltaic cell.

In embodiments, a low n-type doping concentration is advantageous because the depletion width of a NiO/GaN p-n or p-i-n heterojunction depends on the n-type doping concentration. The depletion width will be larger for lower doping concentrations. A large depletion width is desirable because the carriers can transport to the NiO/GaN heterojunction interface by electric field drift, while some amount of carriers can also diffuse to the depletion layer and be collected. In some embodiments, a low doping concentration or insulating GaN can be formed by doping the GaN material layer with carbon. Carbon is advantageous for forming a depletion layer in GaN because carriers can transport by electric field drift without being captured by the carbon sub bandgap traps. An insulating GaN layer formed by carbon doping would have a very large depletion width and thus be able to collect a large number of beta-particles, generated free carriers.

With reference to FIG. 1, in one exemplary embodiment, the p-type semiconductor β-emitter layer 104 is $^{63}$NiO, the n-type semiconductor B-absorber layer 106 is $Ga_2O_3$, and the n-type semiconductor substrate layer 108 is $Ga_2O_3$. Advantageously, neutron irradiation of $Ga_2O_3$ has been shown to result in no gamma emission in the absence of unintentional impurities such as iridium, cobalt, or other known gamma emitters. In another exemplary embodiment, the p-type semiconductor B-emitter layer 104 is $^{63}$NiO, the n-type semiconductor β-absorber layer 106 is a GaN layer, and the n-type semiconductor substrate layer 108 is GaN.

Figure 2:
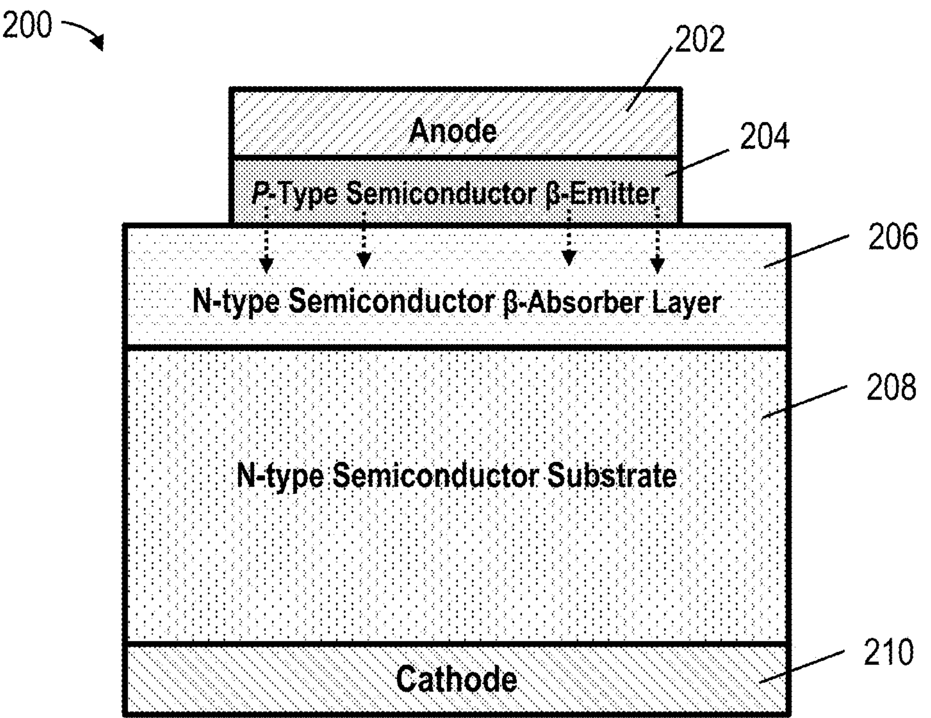
FIG. 2 depicts a second betavoltaic power source in accordance with embodiments of the invention.

FIG. 2 depicts another exemplary betavoltaic power source (battery) 200 in accordance with embodiments of the invention. In the example of FIG. 2, the second betavoltaic power source 200 includes an anode 202, a p-type semiconductor β-emitter layer 204 deposited onto an n-type semiconductor β-absorber layer 206, an n-type semiconductor substrate layer 208, and a cathode 210. In accordance with embodiments of the invention, the p-type semiconductor β-emitter 204, the n-type semiconductor β-absorber layer 206, and the n-type semiconductor substrate layer 208 form a p-n heterojunction diode. In some embodiments, layer 208 is optional, and may be removed such that the p-type semiconductor β-emitter 204 and the n-type semiconductor β-absorber layer 206 form a p-n heterojunction diode.

In embodiments, the anode 202 and cathode 210 may be comprised of the same materials discussed above with respect to the anode 102 and the cathode 110, respectively. Similarly, the p-type semiconductor B-emitter layer 204 may be comprised of the same materials discussed above with respect to the p-type semiconductor β-emitter layer 104, the n-type semiconductor β-absorber layer 206 may be comprised of the same materials discussed above with respect to the n-type semiconductor-absorber layer 106, and the n-type semiconductor substrate layer 208 may be comprised of the same materials discussed above with respect to n-type semiconductor substrate layer 108. In implementations, the n-type semiconductor substrate 208 has a higher doping level ($N^+$), as compared to the n-type semiconductor β-absorber layer 206 ($N^-$).

Figure 3:
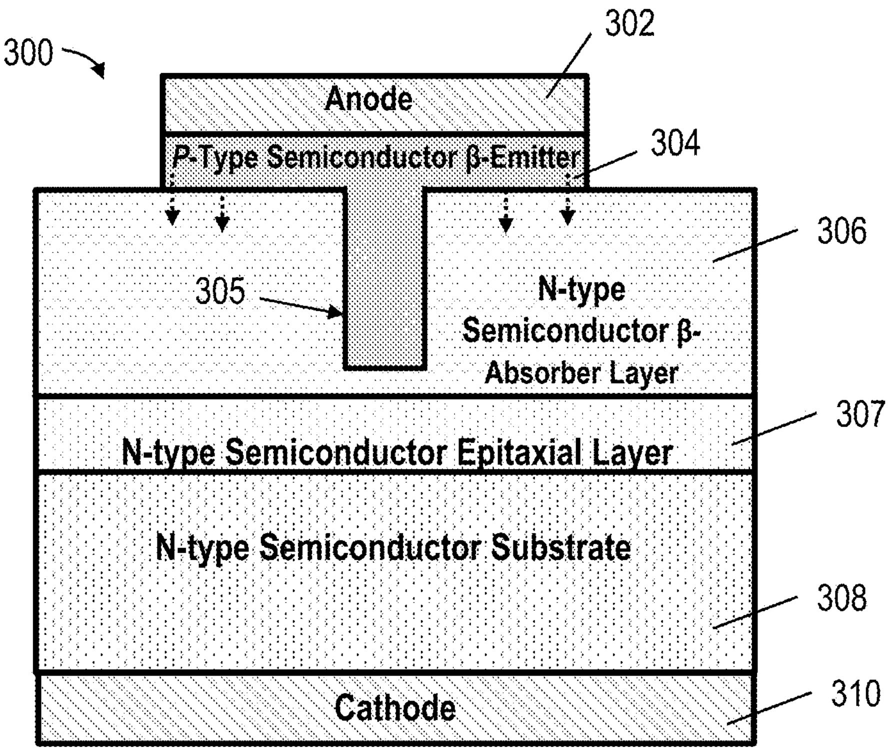
FIG. 3 depicts a third betavoltaic power source in accordance with embodiments of the invention.

FIG. 3 depicts another exemplary betavoltaic power source (battery) 300 in accordance with embodiments of the invention. The betavoltaic power source 300 includes an anode 302, and a p-type semiconductor B-emitter layer 304 extending into at least one trench or channel 305 within an n-type semiconductor β-absorber layer 306. Additionally, an n-type semiconductor epitaxial layer (e.g., drift layer) 307 is provided between the n-type semiconductor β-absorber layer 306 and an n-type semiconductor substrate 308. A cathode 310 is also provided on the n-type semiconductor substrate 308. In implementations, the n-type semiconductor β-absorber layer 308 is an insulating layer. In accordance with embodiments of the invention, the p-type semiconductor B-emitter 304, the n-type semiconductor B-absorber layer 306, the n-type semiconductor epitaxial layer 307, and the n-type semiconductor layer 308 form a p-n heterojunction diode. In implementations, the n-type semiconductor β-absorber layer 306 comprises a lightly-doped layer ($N^-$), as compared to the higher-doped ($N^+$) n-type semiconductor epitaxial layer 307. Likewise, in implementations the n-type semiconductor substrate 308 has a higher doping level ($N^+$), as compared to the n-type semiconductor β-absorber layer 306 ($N^-$).

Although only one trench or channel 305 is shown, is should be understood that multiple trenches/channels 305 of p-type semiconductor β-emitter 304 may extend into the n-type semiconductor β-absorber layer 306. This configuration enables a much higher density of trench/channel three-dimensional structures (3-D structures) over conventional betavoltaic devices that include separate semiconductor layers and β-emitting layers (e.g., metal nickel emitters).

In embodiments, the anode 302 and cathode 310 may be comprised of the same materials discussed above with respect to the anode 102 and the cathode 110, respectively. Similarly, the p-type semiconductor β-emitter 304 may be comprised of the same materials discussed above with respect to the p-type semiconductor β-emitter 104, the n-type semiconductor β-absorber layer 306 may be comprised of the same materials discussed above with respect to the n-type semiconductor β-absorber layer 106, and the n-type semiconductor substrate layer 308 may be comprised of the same materials discussed above with respect to n-type semiconductor substrate layer 108. In implementations, the n-type epitaxial layer is comprised of a wide-bandgap semiconductor material having a bandgap above 2 electron volts (eV). In aspects of the invention, the n-type epitaxial layer comprises Si (1.12 eV bandgap) or GaAs (1.4 eV bandgap).

In one exemplary embodiment, the p-type semiconductor β-emitter 304 is $^{63}$NiO, the n-type semiconductor β-absorber layer 306 is $Ga_2O_3$, the n-type semiconductor epitaxial layer 307 is $Ga_2O_3$, and the n-type semiconductor substrate layer 308 is $Ga_2O_3$. In another exemplary embodiment, the p-type semiconductor β-emitter 304 is $^{63}$NiO, the n-type semiconductor β-absorber layer 306 is a GaN layer, the n-type semiconductor epitaxial layer 307 is GaN, and the n-type semiconductor substrate layer 308 is GaN or sapphire.

Figure 4:
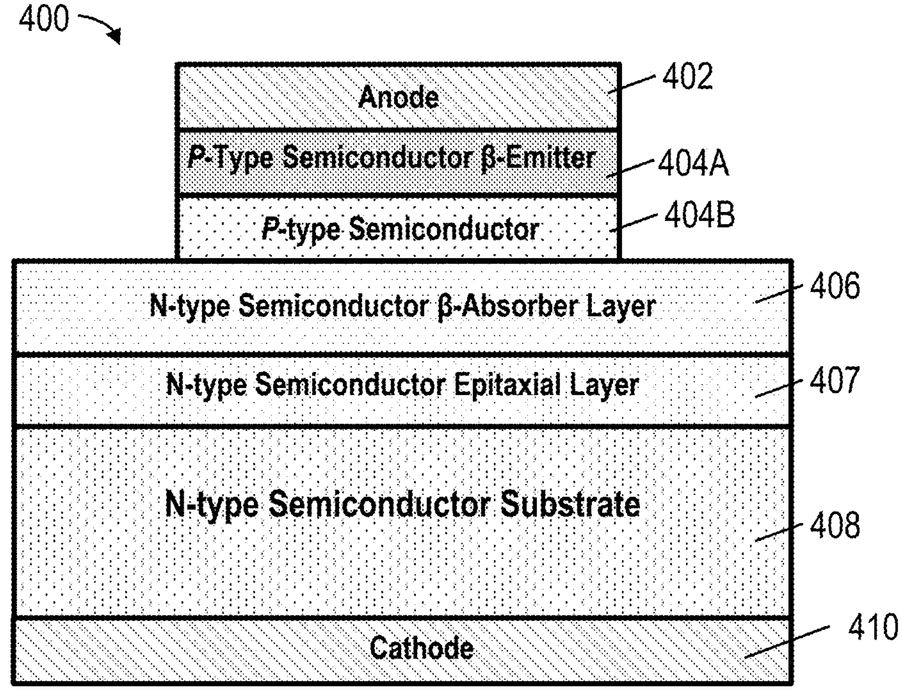
FIG. 4 illustrates a fourth betavoltaic power source in accordance with embodiments of the invention.

FIG. 4 illustrates a fourth exemplary betavoltaic power source (battery) 400 in accordance with embodiments of the invention. The battery 400 includes an anode 402, a p-type semiconductor β-emitter layer 404A, a second p-type semiconductor layer 404B, an n-type semiconductor epitaxial layer 407, an n-type semiconductor substrate layer 408, and a cathode 410. In implementations, the layers 404A and 404B may be sequentially deposited or formed as a gradient via doping. In accordance with embodiments of the invention, the p-type semiconductor β-emitter layer 404A, the p-type semiconductor layer 404B, the n-type semiconductor β-absorber layer 406, and the n-type semiconductor β-absorber layer 408 form a p-n heterojunction diode. In implementations, the n-type semiconductor β-absorber layer 406 comprises a lightly-doped layer ($N^-$), as compared to the higher-doped layers ($N^+$) 407 and 408.

In embodiments, the anode 402 and cathode 410 may be comprised of the same materials discussed above with respect to the anode 102 and the cathode 110, respectively. Similarly, the p-type semiconductor layers 404A and 404B may be comprised of the same materials discussed above with respect to the p-type semiconductor β-emitter 104, the n-type semiconductor β-absorber layer 406 may be comprised of the same materials discussed above with respect to the n-type semiconductor β-absorber layer 106, and the n-type semiconductor substrate layer 408 may be comprised of the same materials discussed above with respect to n-type semiconductor substrate layer 108. In implementations, the n-type semiconductor epitaxial layer 407 and/or the p-type semiconductor layer 404B comprise a wide-bandgap semiconductor material having a bandgap above 2 electron volts (eV). In aspects of the invention, the n-type semiconductor epitaxial layer 407 and/or the p-type semiconductor layer 404B comprise Si (1.12 eV bandgap) or GaAs (1.4 eV bandgap).

In one exemplary embodiment, the p-type semiconductor β-emitter 404A is $^{63}$NiO, the n-type semiconductor β-absorber layer 406 is $Ga_2O_3$, the p-type semiconductor layer 404B is GaN, the n-type semiconductor epitaxial layer 407 is $Ga_2O_3$, and the n-type semiconductor substrate layer 408 is $Ga_2O_3$. In another exemplary embodiment, the p-type semiconductor β-emitter 404A is $^{63}$NiO, the p-type semiconductor layer 404B is GaN, the n-type semiconductor β-absorber layer 406 and the n-type semiconductor epitaxial layer 407 is GaN, and the n-type semiconductor substrate layer 408 is GaN or sapphire.

In use, embodiments of the present invention are configured to directly convert the radioactive decay energy of a β-emitting radioisotope (e.g., from $^{63}$Ni incorporated into a p-type semiconductor such as $^{63}$NiO) into electrical energy employing charge collection in the n-type semiconductor layer(s). Implementations of the invention may be utilized in a number of applications, and may be combined with other layers, elements and devices not discussed herein. By way of example, embodiments of the invention may have applications in microelectromechanical systems (MEMS), remote sensors, medical devices, and other systems.

Methods of Making Wide-Bandgap Semiconductor Betavoltaic Batteries

Various manufacturing methods could be utilized to generate betavoltaic battery devices in accordance with embodiments of the invention, and the betavoltaic battery devices are not intended to be limited to those created by the exemplary manufacturing methods described herein.

Figure 5:
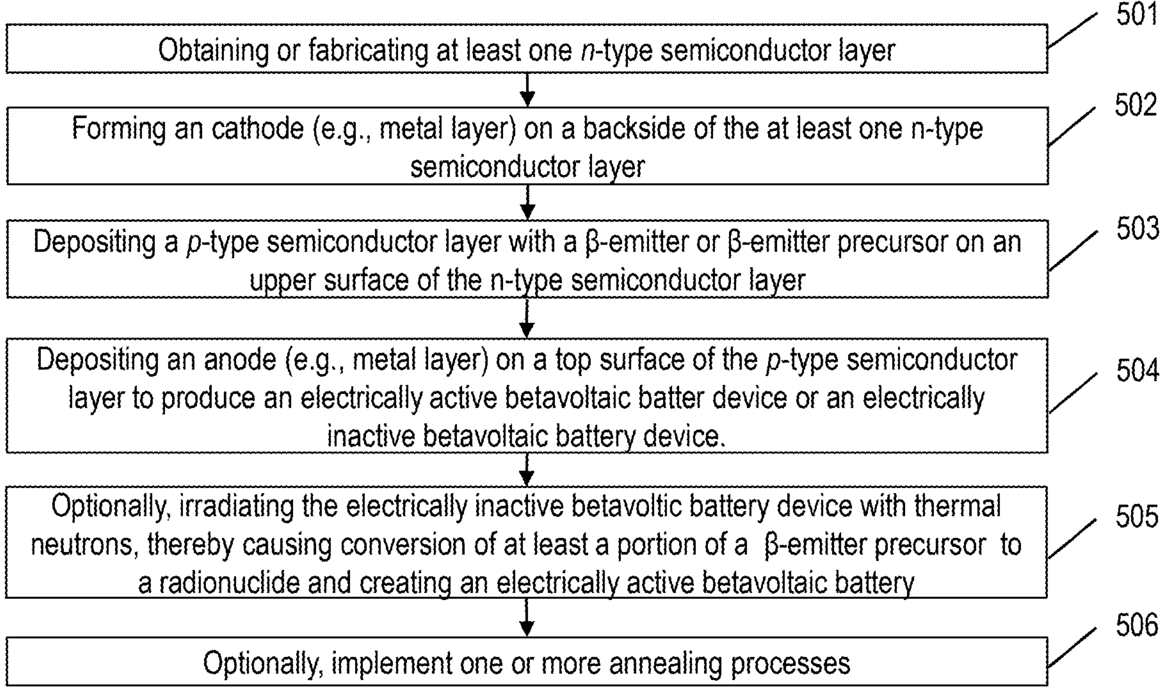
FIG. 5 shows a flowchart of an exemplary method of making a betavoltaic power source in accordance with embodiments of the invention.

A first exemplary method of making a betavoltaic battery will now be discussed with reference to FIG. 5. Implementations of the method may be utilized to create the betavoltaic battery devices of FIGS. 2 and 4, for example.

In embodiments, at step 501, at least one n-type semiconductor layer acting as a β-absorber is obtained or fabricated on a conductive n-type substrate. In the example of FIG. 1, the at least one n-type semiconductor layer comprises layers 206 and 208. In the example of FIG. 4, the at least one n-type semiconductor layer comprises layers 406, 407 and 408.

At step 502, a cathode (e.g., cathodes 210 or 410) is formed on a backside of the at least one n-type semiconductor layer.

At step 503, a p-type semiconductor layer(s) including a β-emitting isotope or β-emitter precursor is deposited on an upper surface of the n-type semiconductor layer. In one example, the p-type semiconductor layer comprises NiO including the β-emitter $^{63}$Ni (i.e., $^{63}$NiO). In another example, the p-type semiconductor layer comprises NiO including a β-emitter precursor in the form of the stable isotope $^{62}$Ni, which transforms into the β-emitting isotope $^{63}$Ni upon exposure to thermal neutron irradiation. $^{63}$Ni isotopes are pure β-emitters with a half-life of 100.2 years. In implementations, the p-type semiconductor layer comprises NiO including a β-emitter precursor in the form of natural Ni or isotopically purified Ni. In the example of FIG. 1, the p-type semiconductor layer(s) comprise layer 204. In the example of FIG. 4, the p-type semiconductor layer(s) comprises layers 404A and 404B. In implementations, step 503 includes depositing a thin film layer of $^{63}$NiO or $^{62}$NiO on an upper surface of the n-type semiconductor layer using molecular beam epitaxy (MBE). The deposition of the initial thin film layer via MBE may result in a lower leakage p-n heterojunction. In embodiments, step 503 further includes the deposition of an additional layer of $^{63}$NiO or $^{62}$NiO onto the thin film layer via sputtering, providing an additional layer of $^{63}$NiO or $^{62}$NiO having a higher carrier concentration (holes) than the initial thin film layer.

At step 504, an anode (e.g., 202) is deposited on the p-type semiconductor layer (e.g., 204 or 404A), thereby resulting in an electrically active betavoltaic battery device, or an electrically inactive betavoltaic battery device in the case where a β-emitter precursor is utilized.

Optionally, at step 505, an electrically inactive betavoltaic battery device produced at step 504 is irradiated with thermal neutrons to convert at least a portion of a β-emitter precursor (e.g., $^{62}$Ni) in the p-type semiconductor layer to a radionuclide (e.g., $^{63}$Ni), thereby creating an electrically active betavoltaic battery device from the electrically inactive betavoltaic battery device. Advantageously, such implementations allow for the fabrication of non-radioactive betavoltaic battery devices in standard semiconductor fabrication facilities, wherein conversion of the devices to active devices via irradiation can occur at a separate appropriate radiation facility and thus no radioactive components are required to be handled during the inactive betavoltaic device manufacturing process. The active betavoltaic device is produced using thermal neutron irradiation after device fabrication. This prevents possible nuclear radioisotope contamination of the manufacturing facility.

As noted above, embodiments of the invention may utilize $Ga_2O_3$. $Ga_2O_3$ can be used in modes for power source applications both in prompt production mode and as betavoltaics. The 160 nuclei of $Ga_2O_3$ will not undergo any significant nuclear transmutation in a lower energy region. $Ga_2O_3$ can produce power from β-particles emitted by the two radioactive gallium isotopes $^{70}Ga$ and $^{72}Ga$, which result from thermal neutron capture on both of the Ga stable isotopes. $^{70}Ga$ has a half-life of 21.1 minutes and emits a B-particle with a mean energy of 648 kiloelectron volts (keV). The cross section for thermal neutron capture on $^{69}Ga$ is ca. 100 b and there are several strong resonance for the capture process in the region of 100-1000 eV. Similarly, for 71Ga the thermal neutron capture cross section is 255 b with similar capture cross section behavior in that resonance energy region. Compared to $^{70}Ga$, $^{71}Ga$ has a longer half-life at 14.1 hour, and emits betas with mean energies of ca. 340 keV. These two nuclei will eventually completely decay into $^{70}Ge$ and $^{72}Ge$, which are both stable and also important dopant ions in $Ga_2O_3$. In embodiments, a $NiO/Ga_2O_3$ heterojunction can be produced and irradiated to form $^{63}NiO/Ga_2O_3$ upon the decay of the Ga radioactive isotopes into stable Ge.

In implementations, GaN is used in a heterojunction with $^{63}NiO$. In addition to the above described neutron reaction of $^{70}Ga$ and $^{72}Ga$, the isotope nitrogen-14 ($^{14}N$) will undergo thermal neutron capture via a $^{14}N(n,p)^{14}C$ nuclear reaction, which has a Q-value of 625 keV. This reaction has a cross section of ca. 1 b for thermal neutron energies of 0.025 eV. This interaction produces a proton with kinetic energy of 584 keV and a recoiling 14C nucleus with 42 keV of kinetic energy. A residual carbon-14 isotope (14C) with a half-life of 5700 years will continue to emit β-particles with a mean energy of roughly 50 keV. This total amount of energy can thus be "harvested" from reactor-based sources of thermal neutrons to produce power.

Optionally, at step 506, one or more annealing processes may be implemented to anneal layers of an electrically active betavoltaic battery device created at step 505.

Figure 6:
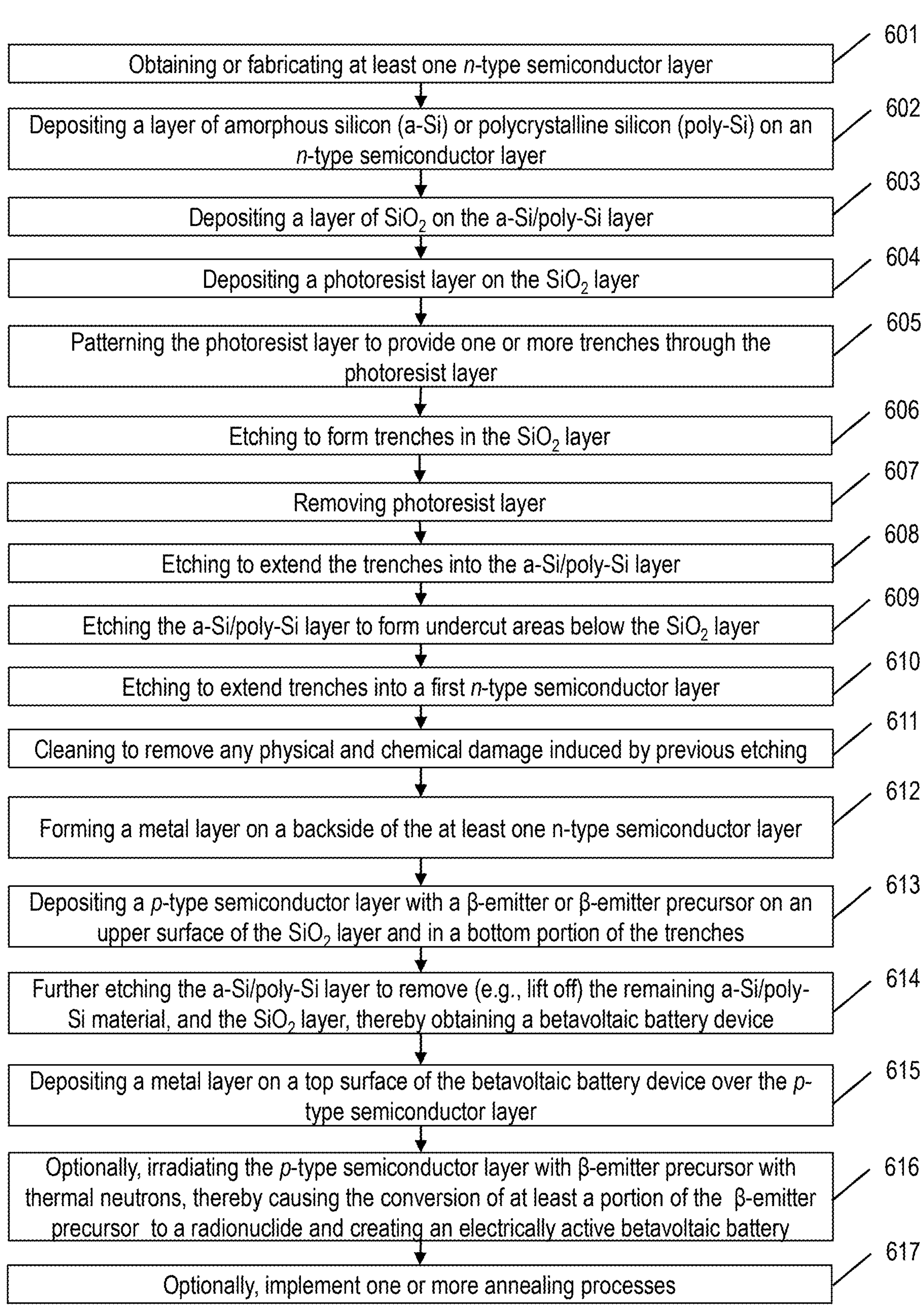
FIG. 6 shows a flowchart of another exemplary method of making a betavoltaic power source in accordance with embodiments of the invention.
Figure 7A:
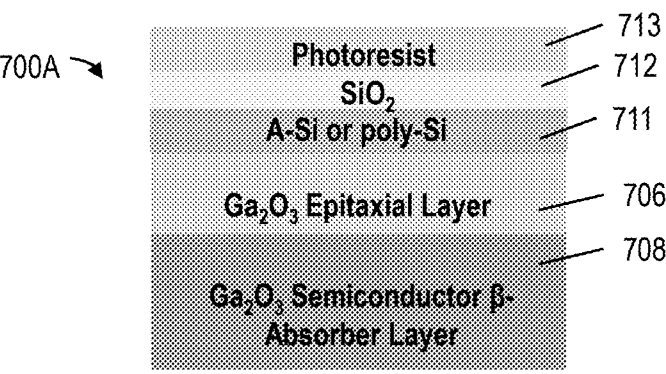
FIGS. 7A-7G illustrate instances of a wide-bandgap semiconductor betavoltaic power source during manufacturing in accordance with embodiments of the invention.
Figure 7B:
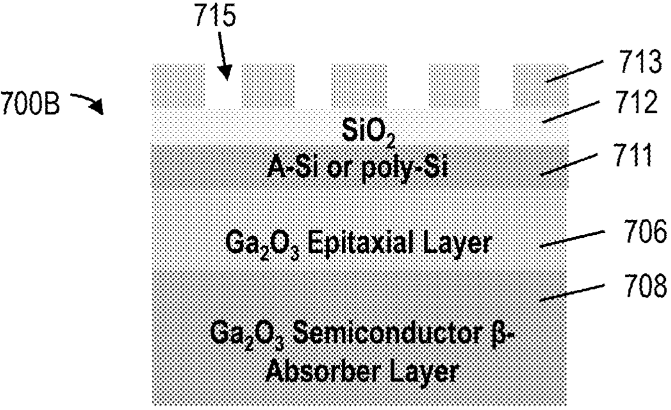
Figure 7C:
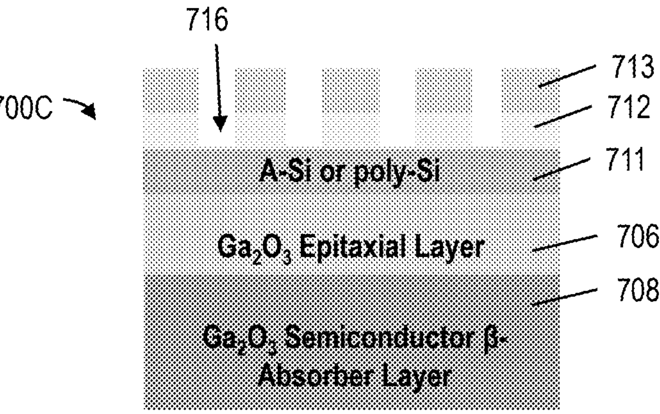
Figure 7D:
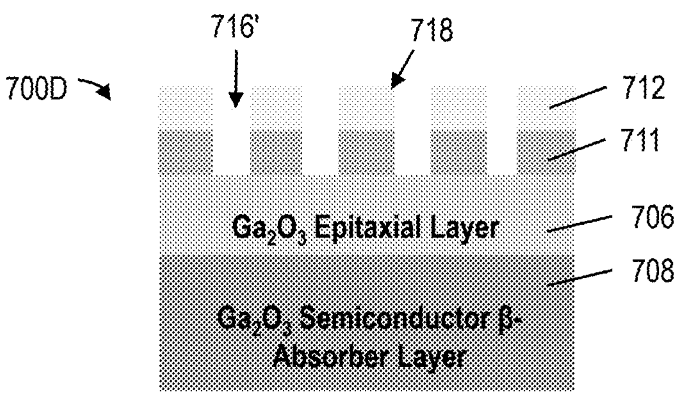
Figure 7E:
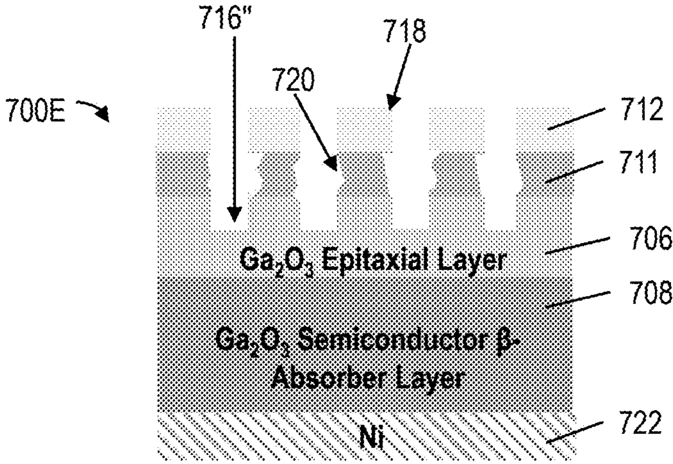
Figure 7F:
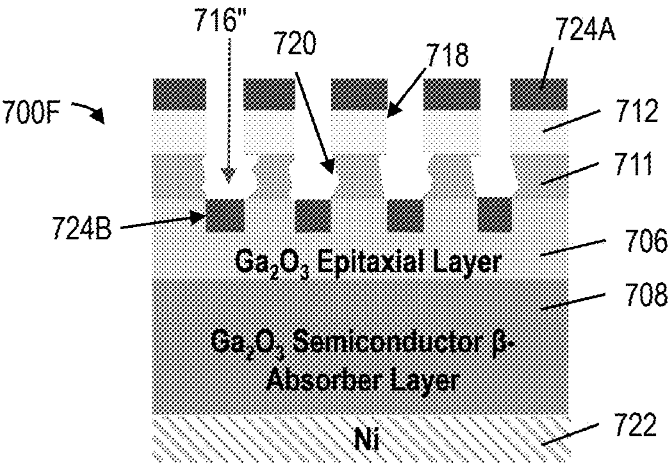
Figure 7G:
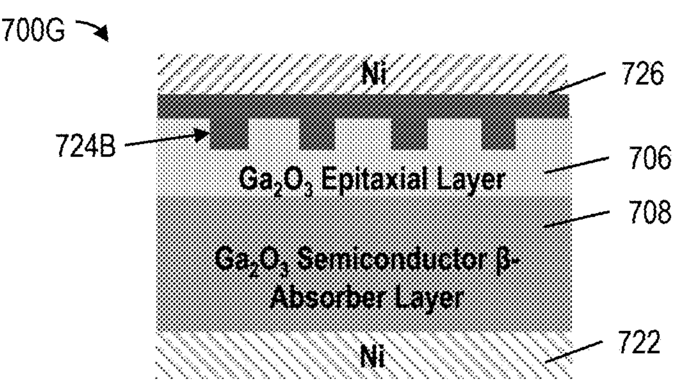

FIG. 6 shows a flowchart of another exemplary method of making a betavoltaic battery device in accordance with embodiments of the invention. Implementations of FIG. 6 may be utilized to produce the exemplary betavoltaic battery devices of FIGS. 1 and 3, for example.

In some embodiments of the invention, a p-type semiconductor material (e.g., $^{63}NiO$ or $^{62}NiO$) of the invention is deposited in one or more predefined trenches etched into a bulk or epitaxial n-type semiconductor (e.g., $Ga_2O_3$, or GaN) layer to form a patterned heterojunction for the operation of a betavoltaic power source. Alternatively, an n-type semiconductor (e.g., $Ga_2O_3$, or GaN) layer of the invention may be deposited into one or more predefined trenches etched into a bulk or epitaxial p-type semiconductor material (e.g., $^{63}NiO$ or $^{62}NiO$) of the invention to form a patterned heterojunction for the operation of a betavoltaic power source.

In one exemplary embodiment, a self-aligned lithography process is utilized to fabricate a p-n heterojunction semiconductor diode in which a p-type semiconductor material comprising active $^{63}NiO$ or inactive $^{62}NiO$ is deposited into etched regions of an n-type $Ga_2O_3$ semiconductor β-absorber layer. A single lithography mask may be used for etching trenches in the n-type $Ga_2O_3$ semiconductor β-absorber layer, providing defined areas for the deposition of the p-type semiconductor material. Exemplary method steps for generated a multi-channel betavoltaic battery device will now be discussed with reference to FIGS. 6 and 7A-7F.

FIGS. 7A-7G illustrate instances of a semiconductor betavoltaic battery device during manufacturing in accordance with embodiments of the invention. Elements referenced in the method of FIG. 6 are illustrated in corresponding FIGS. 7A-7G.

At step 601, at least one n-type semiconductor layer is obtained or fabricated. In implementations, the first n-type semiconductor layer is a bulk layer or an epitaxial layer. See, for example, a first instance 700A of a betavoltaic battery device during manufacturing in FIG. 7A, wherein the at least one n-type semiconductor layer is in the form of a $Ga_2O_3$ epitaxial layer 706 deposited on a $Ga_2O_3$ semiconductor β-absorber layer 708. The $Ga_2O_3$ may be in the form of β-$Ga_2O_3$.

In implementations, β-$Ga_2O_3$ may be grown from a melt source by multiple techniques (Edge-Defined Film-Fed Growth Method and Czochralski methods) similar to silicon bulk growth technology. The β-$Ga_2O_3$ may comprise iridium-free crystal grown via Float Zone or Vertical Bridgman methods. A near equilibrium growth process for β-$Ga_2O_3$ results in very high-quality crystals with low defect density, which are inexpensive compared with other wide and ultra-wide bandgap substrates.

At step 602, amorphous silicon (a-Si) or polycrystalline silicon (poly-Si) is deposited on the at least one n-type semiconductor layer. The a-Si or poly-Si layer may have a thickness of between 0.5-1 micrometers (μm). See, for example, FIG. 7A, wherein an a-Si or poly-Si layer 711 is deposited on the $Ga_2O_3$ epitaxial layer 706.

At step 603, a thin (e.g., 100-200 nanometers) silicon dioxide ($SiO_2$) layer is deposited on the a-Si or poly-Si layer. See, for example, FIG. 7A, wherein a $SiO_2$ layer 712 is shown deposited on the a-Si or poly-Si layer 711.

At step 604, a photoresist is deposited on the $SiO_2$ layer. See, for example, FIG. 7A, wherein a photoresist layer 713 layer is shown deposited on the $SiO_2$ layer 712.

At step 605, the photoresist is patterned in a predetermined manner to provide one or more trenches in the photoresist. See, for example, a second instance 700B of a betavoltaic battery device during manufacturing in FIG. 7B, wherein trenches 715 are patterned into the photoresist 713.

At step 606, areas of the $SiO_2$ exposed by the trenches are etched using a suitable etching technique to form trenches in the $SiO_2$ layer. See, for example, a third instance 700C of a betavoltaic battery device during manufacturing in FIG. 7C, wherein trenches 716 are etched into the $SiO_2$ layer 712.

At step 607, the photoresist layer is removed. Existing photoresist removal techniques may be utilized.

At step 608, the a-Si or poly-Si layer is etched (e.g., anisotropically using sulfur hexafluoride) to extend the trenches into the a-Si/poly-Si layer to form mesas comprised of the $SiO_2$ and a-Si/poly-Si layers. See, for example, a fourth instance 700D of a betavoltaic battery device during manufacturing in FIG. 7D, wherein the photoresist 713 has been removed and trenches 716 are extended by etching to form trenches 716' and mesas 718.

At step 609, a second etching is performed (e.g., using xenon difluoride) in the trenches to remove material from the $SiO_2$ layer to form areas undercutting the a-Si/poly-Si layer. These undercut areas enable the remove of the a-Si/poly-Si layer and the $SiO_2$ layer after deposition of a p-type semiconductor (e.g., $^{63}$NiO or $^{62}$NiO) in accordance with embodiments of the invention. See, for example, a fifth instance 700E of a betavoltaic battery device during manufacturing in FIG. 7E, wherein undercut areas (e.g., 720) are formed in the a-Si/poly-Si layer 711.

At step 610, trenches are extending into the first n-type semiconductor layer with further etching. Etching of the first n-type semiconductor layer may be performed utilizing any suitable etching method (e.g., using boron trichloride). In the example, of FIG. 7E, the trenches 716' are extended into an upper portion of the $Ga_2O_3$ epitaxial layer 706, thereby forming new trenches 716".

At step 611, sidewalls of the trenches, as well as undercuts areas, are cleaned to remove any physical and chemical damage induced by previous etching steps (e.g., using a hot phosphoric wet etch). An existing cleaning process may be utilized in accordance with step 611.

Optionally, at step 612, a metal layer (cathode) may be formed on a backside of the at least one n-type semiconductor layer utilizing an appropriate annealing process. In the betavoltaic battery device instance 700E of FIG. 7E, a nickel (Ni) layer 722 is shown deposited on a backside of a second n-type semiconductor layer in the form of $Ga_2O_3$ semiconductor β-absorber layer 708, in accordance with step 612.

At step 613, a p-type semiconductor layer including a β-emitter or a β-emitter precursor is deposited on the upper surface of the $SiO_2$ layer and in the trenches formed in the at least one n-type semiconductor layer. The p-type semiconductor layer may partially or completely fill the trenches formed in the at least one n-type semiconductor layer. Sputtering (i.e., physical vapor deposition) of a p-type semiconductor layer may damage a semiconductor surface to which it is applied, creating point defects in a top 30 nm of the semiconductor surface. In implementations, the p-type semiconductor layer is deposited using an alternative vapor deposition process, such as chemical vapor deposition, atomic layer deposition, and plasma enhanced vapor deposition, thus avoiding the point defects typically caused by sputtering.

In some embodiments, step 613 comprises depositing a p-type semiconductor layer including a β-emitter to produce an electrically active betavoltaic battery device. See, for example, instance 700F of a betavoltaic battery device during manufacturing in FIG. 7F, wherein $^{63}$NiO is deposited on an upper surface of the $SiO_2$ layer 712, as depicted at 724A, and within a bottom portion of trenches 716" formed within the $Ga_2O_3$ epitaxial layer 706, as depicted at 724B. In implementations, an interface state density at the $^{63}$NiO material that is in contract with the n-type semiconductor layer is preferably less than 5e12 $cm^{-2}$.

Alternatively, step 613 comprises depositing a p-type semiconductor layer including a β-emitter precursor (e.g., NiO including $^{62}$Ni), to produce an electrically inactive betavoltaic battery device. In such embodiments, the electrically inactive betavoltaic battery device may be converted to an electrically active betavoltaic device by transforming the β-emitter precursor to a β-emitter using thermal neutron irradiation at a later step.

At step 614, the a-Si/poly-Si layer is further etched (e.g., using xenon difluoride, $XeF_2$) to remove the remaining a-Si/poly-Si material. The $SiO_2$ with deposited 63NiO is simultaneously removed, e.g., lifted-off, at step 614, or subsequently removed in a substep using known methods. The structure may then be rinsed to remove any remaining photoresist or other mask material, resulting in a betavoltaic power source. See, for example, the betavoltaic battery device 700G in FIG. 7G with the a-Si/poly-Si 711, $SiO_2$ 712, and $^{63}$NiO 724A layers removed.

Optionally, at step 615, a metal layer may be deposited on a top surface of the betavoltaic battery device. See, for example, the metal Ni layer 226 in FIG. 7G. It should be understood that additional layers than those shown may be added to the betavoltaic battery device according to embodiments of the invention, and the invention is not intended to be limited to only those layers depicted herein.

Optionally, at step 616, the betavoltaic battery device produced from the above-identified steps is subjected to thermal neutron irradiation to convert at least a portion of a β-emitter precursor in the p-type semiconductor layer into a radionuclide which emits β-particles, thereby transforming the betavoltaic battery device from an electrically inactive betavoltaic battery device to an electrically active betavoltaic device. Advantageously, implementations of the invention enable production of a stable electrically inactive betavoltaic battery device in a conventional cleanroom without any special measures necessary to accommodate electronic device fabrication using radioactive semiconductor materials. The electrically inactive betavoltaic battery device may then be transported to another location for irradiation to transform at least some of a stable isotope to a radionuclide, resulting in the electrically active betavoltaic battery.

Optionally, at step 617, the betavoltaic battery device may be subjected to one or more annealing processes to optimize the p-type semiconductor characteristics, reduce surface states, and increase the bandgap of the p-type semiconductor material. In embodiments, one or more annealing process are performed after optional step 616 to reduce defects introduced by the thermal neutron irradiation.

It should be understood that various steps listed above may be performed in an alternative order, or not performed at all for fabrication process simplicity, unless stated otherwise, and embodiments of the invention are not intended to be limited to the exemplary sequence of steps listed herein. The descriptions of the various embodiments of the present invention have been presented for purposes of illustration, but are not intended to be exhaustive or limited to the embodiments disclosed. Embodiments shown in figures herein are not to scale. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrically inactive betavoltaic battery device comprising:

a p-type semiconductor layer including at least one stable isotope that transforms into a beta emitter upon irradiation with thermal neutrons; and an n-type semiconductor beta-absorber layer configured to absorb beta particles;

wherein the p-type semiconductor layer and the n-type semiconductor layer form a p-n diode, and wherein the electrically inactive betavoltaic battery device is configured to be transformed into an electrically active betavoltaic battery upon irradiation with thermal neutrons.

2. The electrically inactive betavoltaic battery device of claim 1, wherein the p-type semiconductor layer comprises nickel oxide including nickel-62 ($^{62}Ni$).

3. The electrically inactive betavoltaic battery device of claim 1, wherein the n-type semiconductor beta-absorber layer comprises a wide-bandgap semiconductor material.

4. The electrically inactive betavoltaic battery device of claim 3, wherein the n-type semiconductor beta-absorber layer is selected from the group consisting of: gallium oxide ($Ga_2O_3$), gallium nitride (GaN), silicon carbide (SiC), diamond, and aluminum nitride (AlN).

5. The electrically inactive betavoltaic battery device of claim 1, wherein the n-type semiconductor beta-absorber layer is an epitaxial layer.

6. The electrically inactive betavoltaic battery device of claim 1, wherein the n-type semiconductor beta-absorber layer is a substrate layer.

7. The electrically inactive betavoltaic battery device of claim 1, further comprising one or more electrodes.

8. The electrically inactive betavoltaic battery device of claim 7, wherein the one of more electrodes comprise nickel (Ni).

9. The electrically inactive betavoltaic battery device of claim 1, further comprising a second n-type semiconductor layer between the n-type semiconductor beta-absorber layer and the p-type semiconductor layer, wherein the p-type semiconductor layer, the n-type semiconductor beta-absorber layer, and the second n-type semiconductor layer comprise the p-n diode.

10. The electrically inactive betavoltaic battery device of claim 9, wherein the second n-type semiconductor layer is selected from the group consisting of: gallium oxide ($Ga_2O_3$), gallium nitride (GaN)), silicon carbide (SiC), diamond, and aluminum nitride (AlN).

11. The electrically inactive betavoltaic battery device of claim 9, wherein the p-type semiconductor layer extends into at least one trench formed in the n-type semiconductor beta-absorber layer.

12. A method of making an electrically inactive betavoltaic battery device comprising:

fabricating a p-n diode comprising a p-type semiconductor layer including at least one stable isotope that transforms into at least one beta-particle emitter upon irradiation with thermal neutrons, and an n-type semiconductor beta-particle absorber layer configured to absorb beta particles.

13. The method of claim 12, wherein the p-type semiconductor layer comprises nickel oxide including $^{62}Ni$ ($^{62}NiO$).

14. The method of claim 12, wherein the n-type semiconductor beta-particle absorber layer is selected from the group consisting of: gallium oxide ($Ga_2O_3$), gallium nitride (GaN), silicon carbide (SiC), diamond, and aluminum nitride (AlN).

15. The method of claim 12, further comprising fabricating a drift layer in the form of an n-type epitaxial layer between the n-type semiconductor beta-absorber layer and the p-type semiconductor layer.

16. The method of claim 12, wherein the p-type semiconductor layer is formed in trenches within the n-type semiconductor beta-absorber layer.

17. The method of claim 12, further comprising fabricating a substrate comprising another n-type semiconductor layer selected from the group consisting of: gallium oxide ($Ga_2O_3$) and gallium nitride (GaN).

18. A method of making an electrically active betavoltaic battery comprising:

providing an electrically inactive betavoltaic battery device comprising a p-type semiconductor layer including at least one stable isotope that transforms into at least one beta-particle emitter upon irradiation with thermal neutrons, and an n-type semiconductor beta-particle absorber layer configured to absorb beta particles, wherein the p-type semiconductor layer and the n-type semiconductor beta-particle absorber layer form a p-n diode; and irradiating the electrically inactive betavoltaic battery device with thermal neutrons, thereby causing the conversion of at least a portion of the at least one stable isotope to a radionuclide and creating the electrically active betavoltaic battery.

19. The method of claim 18, wherein the p-type semiconductor layer comprises nickel oxide, the at least one stable isotope within the nickel oxide comprises nickel-62 ($^{62}Ni$), and the at least one beta-particle emitter comprises $^{63}Ni$.

20. The method of claim 18, wherein the n-type semiconductor beta-particle absorber layer is selected from the group consisting of: gallium oxide ($Ga_2O_3$), gallium nitride (GaN), silicon carbide (SiC), diamond, and aluminum nitride (AlN).

* * * * *